Figure 7A:
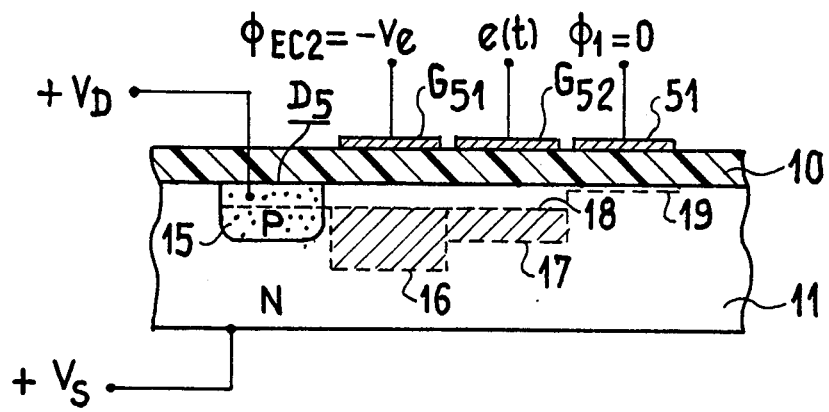

United States Patent [19]

Benoit-Gonin et al.

[11] 4,145,676
[45] Mar. 20, 1979

[54] INPUT STAGE FOR A CTD LOW-PASS FILTER

[75] Inventors: Roger Benoit-Gonin; Jean L. Berger; Sylvain Fontanes, all of Paris, France

[73] Assignee: Thomson-CSF, Paris, France

[21] Appl. No.: 788,779

[22] Filed: Apr. 19, 1977

[30] Foreign Application Priority Data

Apr. 23, 1976 [FR] France .............................. 76 12064

[51] Int. Cl.² ...................... H03H 7/28; H01L 27/10; G11C 19/28; H01L 29/78
[52] U.S. Cl. ................................ 333/165; 307/221 C; 307/221 D
[58] Field of Search ..................... 333/70 T, 70 R, 29, 333/18, 70 A, 28 R; 364/825-827, 862; 307/303, 304, 221 R, 221 C, 221 D, 294; 357/24; 328/167, 37

[56] References Cited
U.S. PATENT DOCUMENTS

| | | | |
|---|---|---|---|
| 3,819,953 | 6/1974 | Puckette et al. | 307/221 D |
| 3,940,602 | 2/1976 | Lagnado et al. | 364/826 X |
| 4,032,867 | 6/1977 | Engeler et al. | 307/221 D X |

OTHER PUBLICATIONS

Smith et al—"Programmable Bandpass Filter and Tone Generator Using Bucket Brigade Delay Lines", in IEEE Transactions on Communications, vol. COM-22, No. 7, Jul. 1974, pp. 921-925.

*Primary Examiner*—Alfred E. Smith
*Assistant Examiner*—Marvin Nussbaum
*Attorney, Agent, or Firm*—Roland Plottel

[57] ABSTRACT

An input stage for a transversal charge transfer filter, which suppresses parasitic image frequencies. It comprises two parallel channels to which the input signal is applied simultaneously. Sampling of the signal is performed in each channel with a periodicity Te, and a relative phase-shift of Te/2. The two samples are then added in order to eliminate components having periodicities in the neighborhood of Te.

6 Claims, 14 Drawing Figures

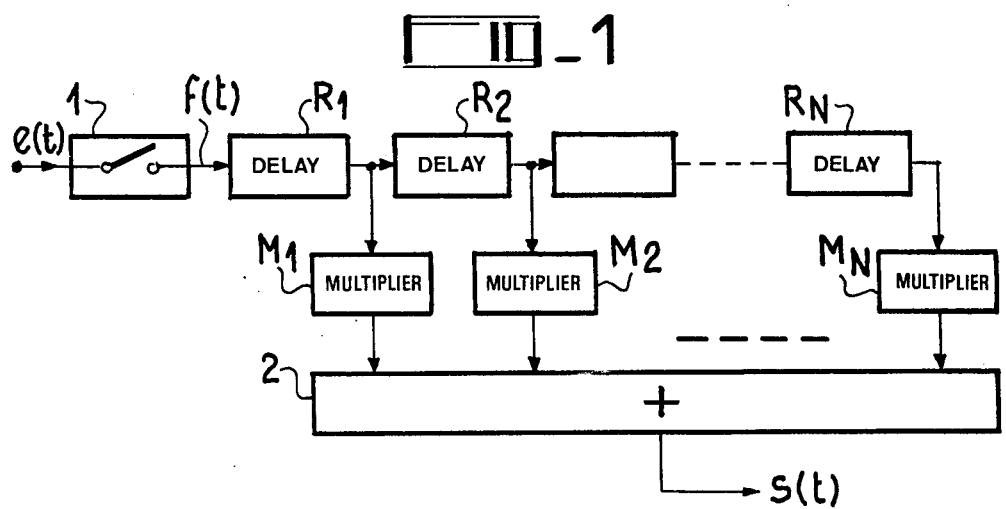
FIG_1
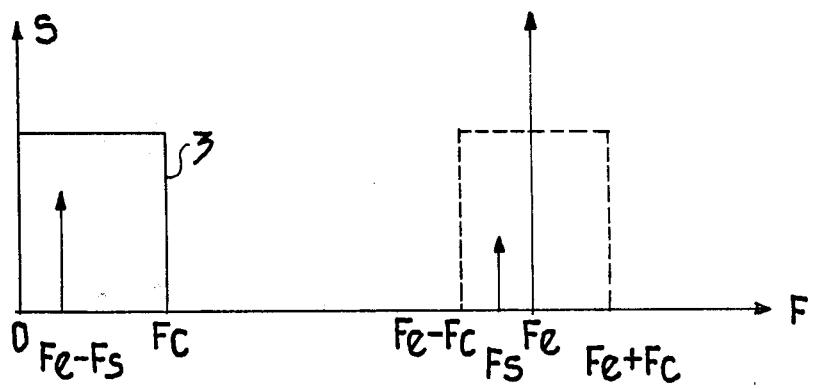
FIG_2
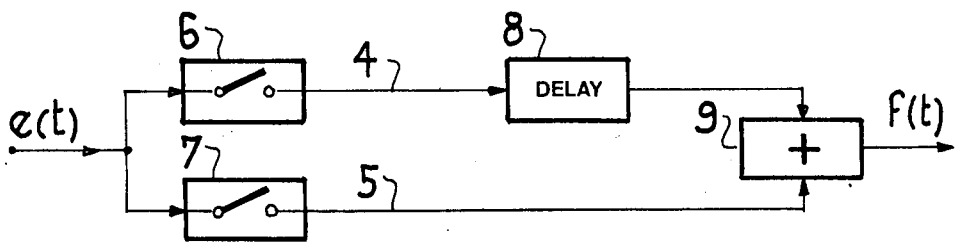
FIG_3

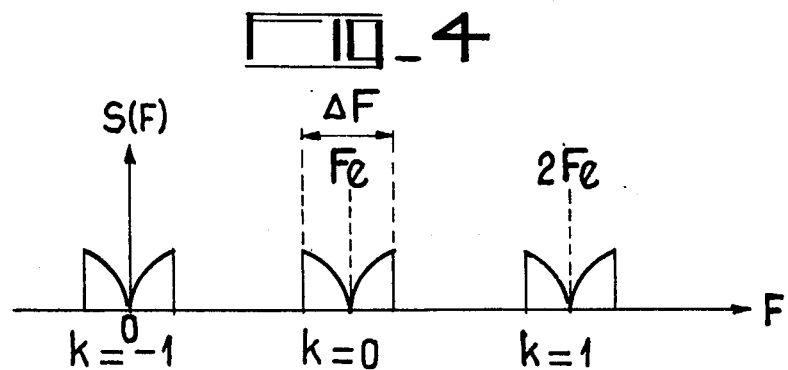
FIG_4
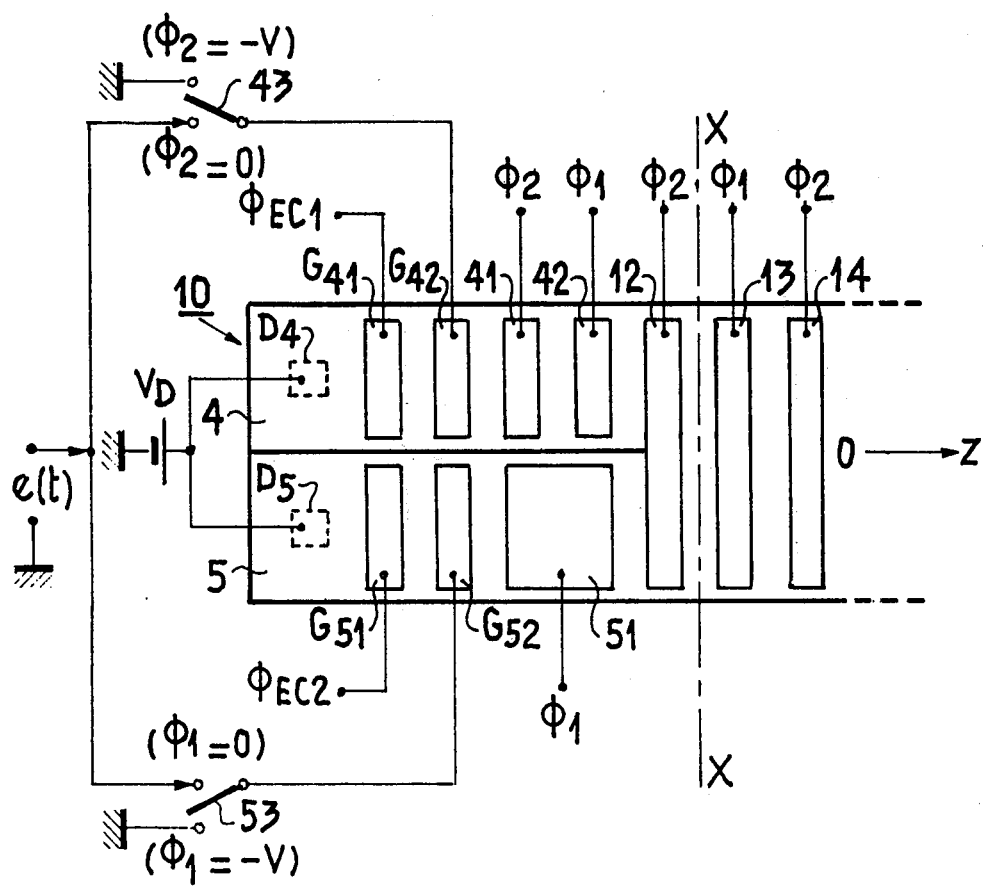
FIG_5

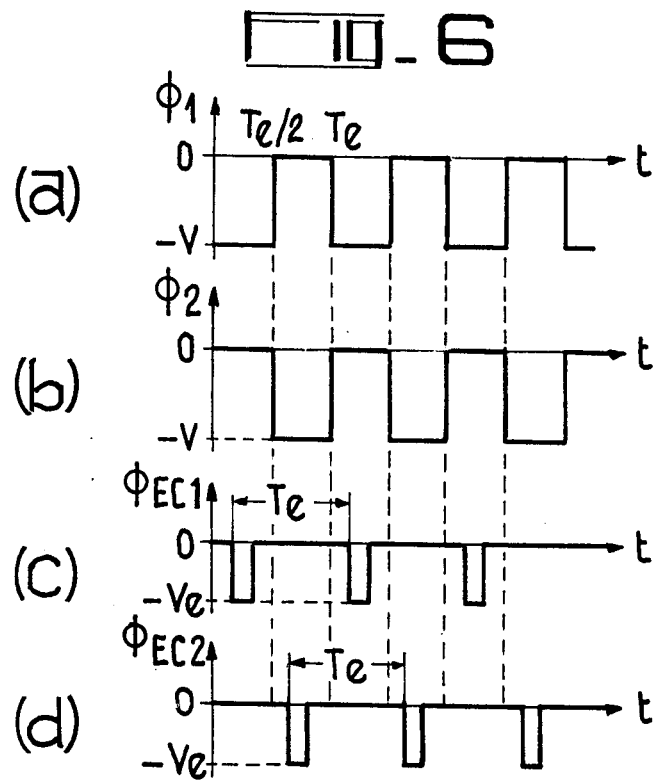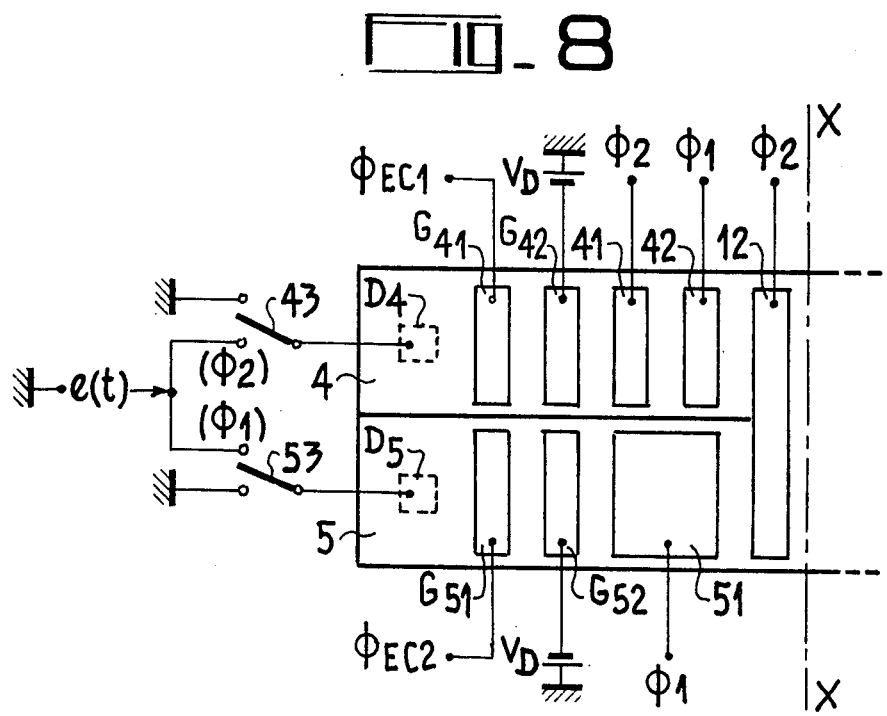

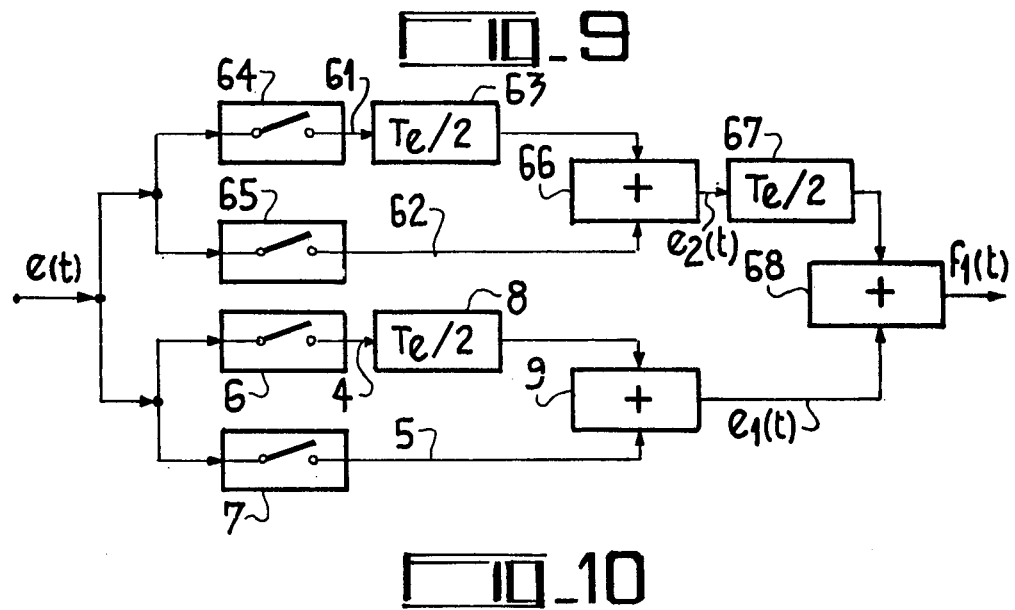
FIG_9
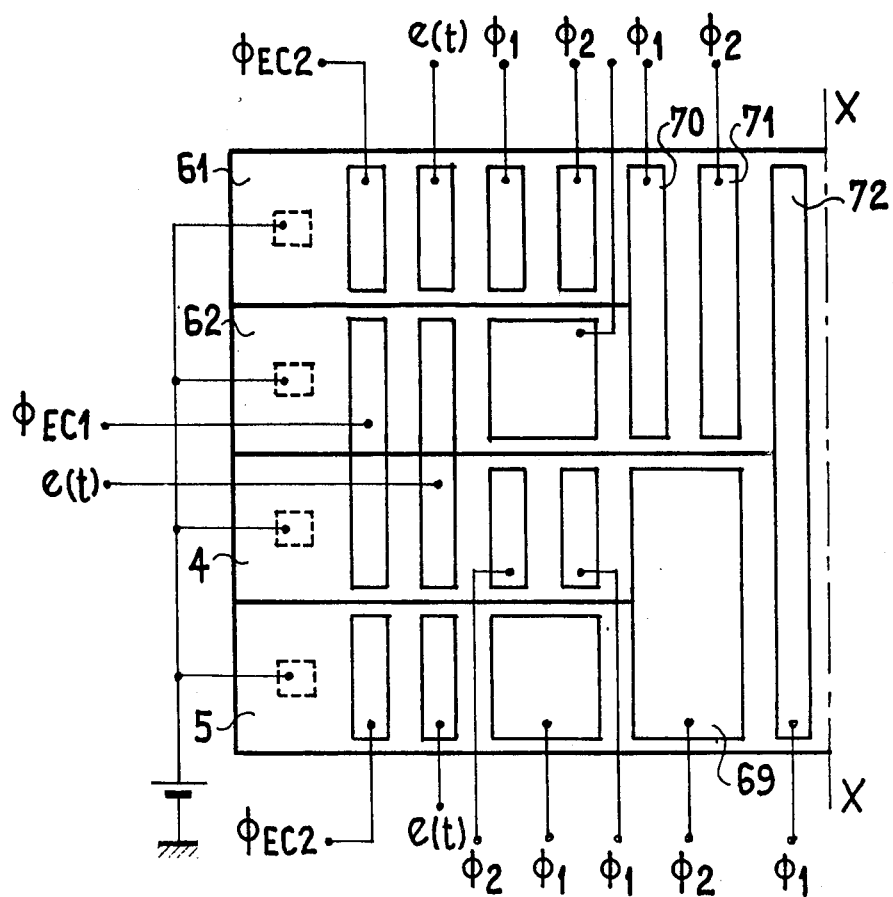
FIG_10

INPUT STAGE FOR A CTD LOW-PASS FILTER

The present invention relates to low-pass filters using the phenomenon of electrical charge transfer occurring in a semiconductor. It relates more particularly to an input stage for this kind of CTD (Charge Transfer Device) filter, which attenuates parasitic frequencies.

The design of CTD low-pass filters, often referred to as transversal filters, poses a classic problem due to the fact that the input stage is a sampling stage. In other words, when the input signal contains a component of frequency Fs close to the sampling frequency Fe, by a process of frequency mixing, two parasitic signals at the image frequencies Fe + Fs and Fe − Fs are created. Since we are concerned with a low-pass filter, the top image frequency (Fe + Fs) is automatically eliminated but the bottom image frequency (Fe − Fs) can be transmitted by the filter and appear in the output signal if the condition Fe − Fs < Fc is realised, Fc being the cut-off frequency of the low-pass filter.

A well-known solution to this problem is to add to the transversal filter an associated band-stop filter for suppressing from the input signal any components whose frequencies are located between Fc and Fe + Fc. This kind of associated filter is outside the CTD filter and is generally made with the help of RC networks. The fact that it is outside the low-pass filter is a drawback especially from the point of view of bulk. A second drawback is due to the fact that the attenuation in the band which is to be stopped, is inadequate: it does not generally exceed a ratio of 4.

The object of the present invention is to integrate into the input stage of a CTD transversal filter a band-stop filter designed by the application of a so-called cosine filtering method.

According to the invention, there is provided an input stage for a CTD low-pass filter, comprising a semiconductor substrate, an insulating layer deposited upon the substrate, said substrate comprising at least two insulated channels, each channel receiving said input signal and comprising sampling means, said sampling means comprising a diode formed in said substrate and two sampling gates, arranged upon said insulating layer, the samples being constituted by electrical charges capable of moving through said substrate, the sampling performed in the first channel exhibiting a phase advance in relation to the sampling performed in the second channel, substantially equal to half the sampling period, said stage further comprising electrodes arranged on each of said channels after said sampling gates, in order to delay the sample formed in the first channel by a time substantially equal to said phase advance, said channels being united by a single summing electrode, extending simultaneously over the two channels and additing the samples formed in them.

Figure 7B:
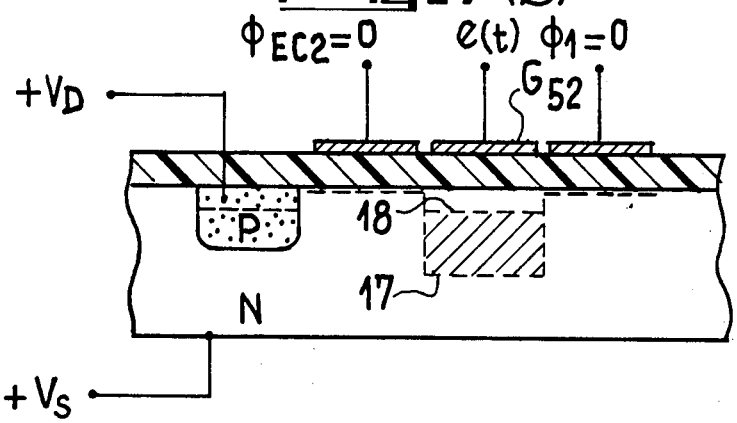
Figure 7C:
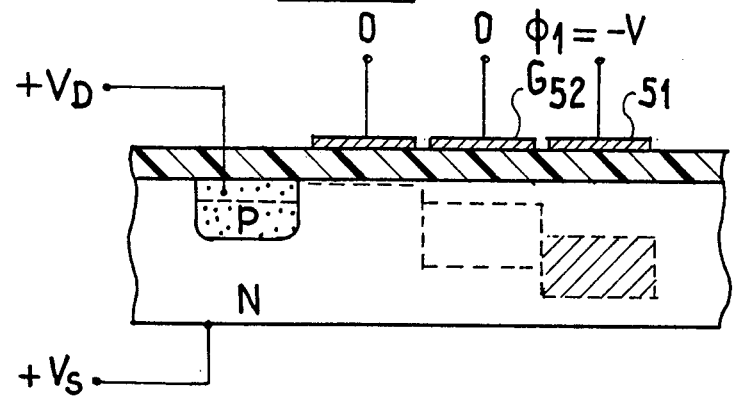
Figure 11:
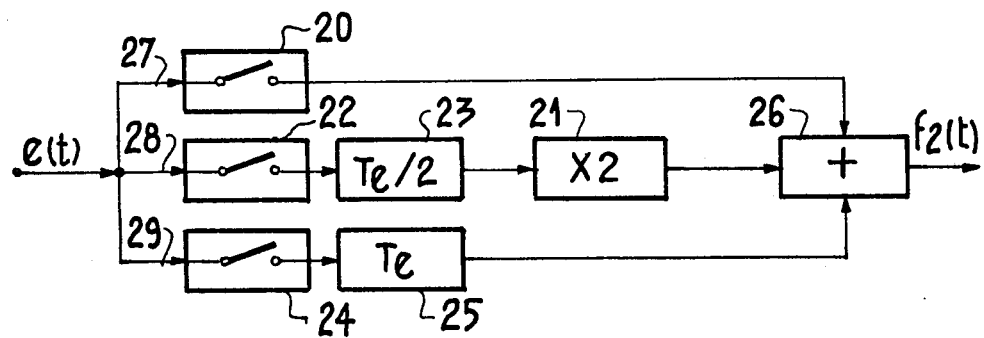
Figure 12:
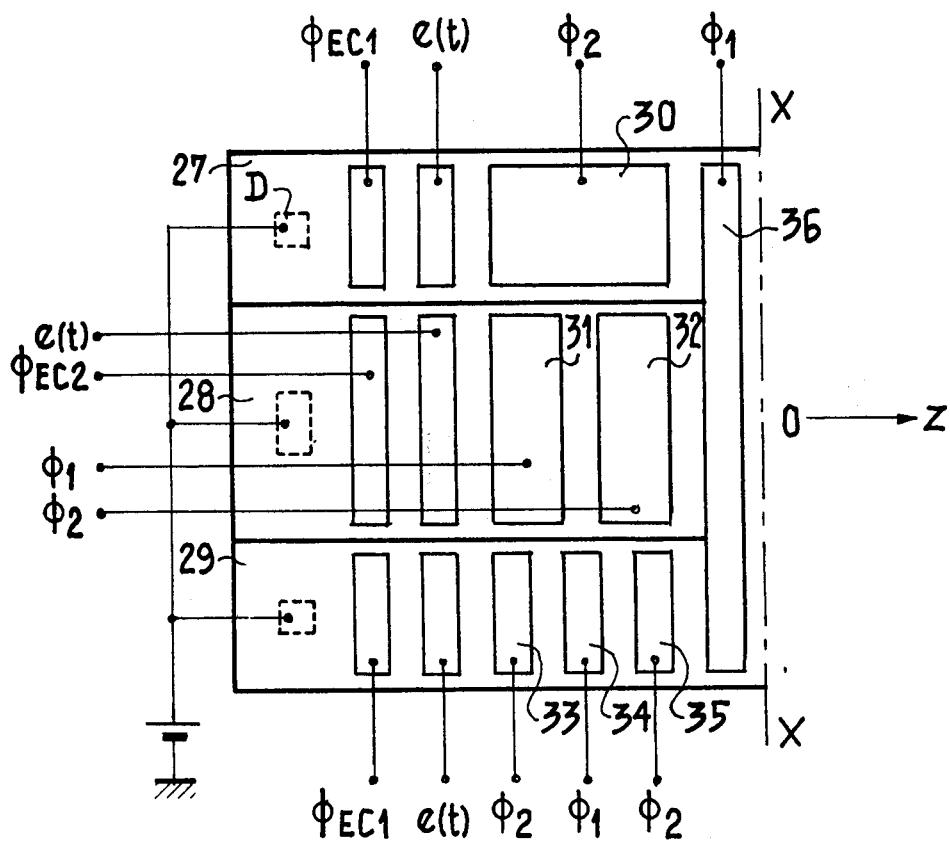
Figure 13:
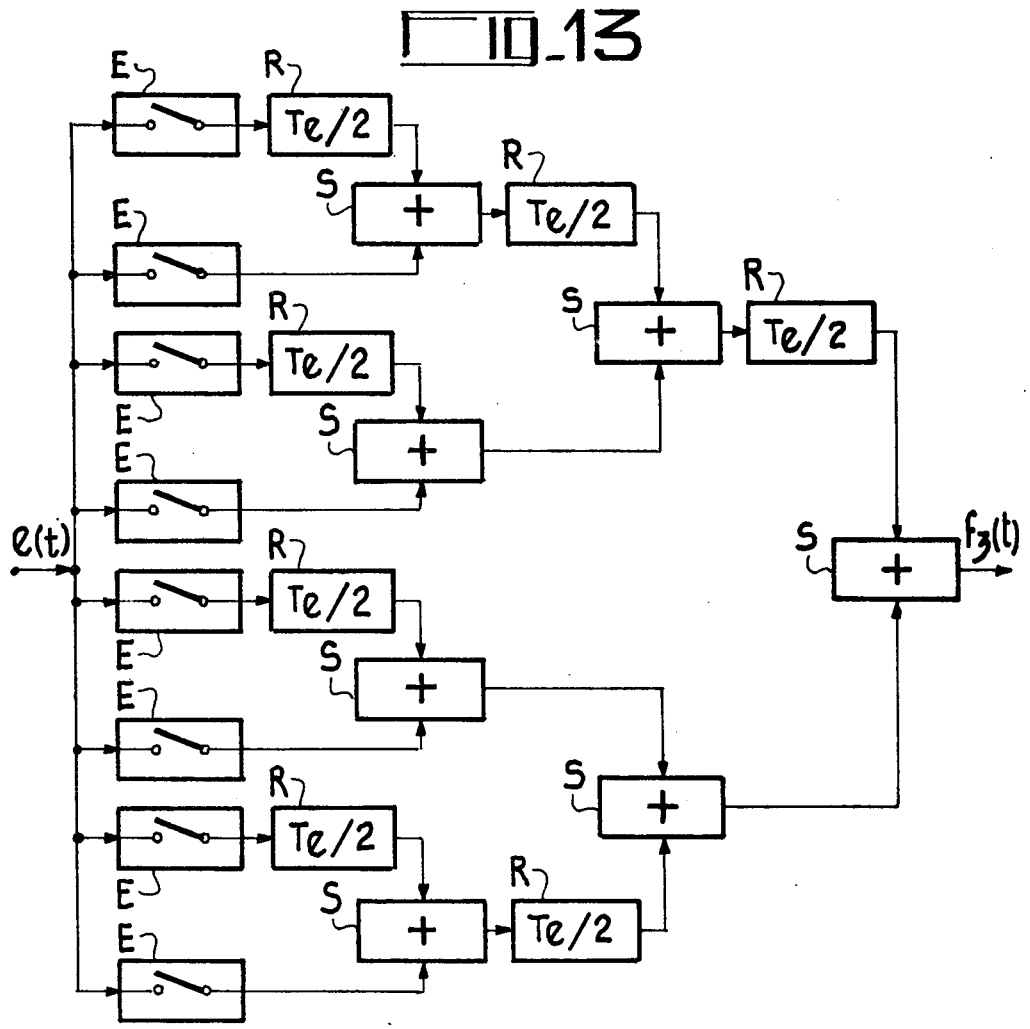
Figure 14:
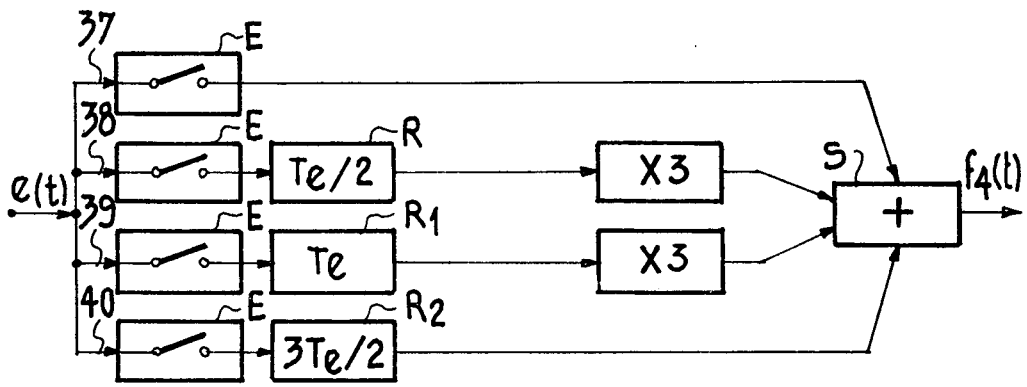

For a better understanding of the invention and to show how it may be carried into effect, reference will be made to the following description illustrated by the attached drawings in which:

FIG. 1 is the block diagram of a CTD low-pass filter;
FIG. 2 is a frequency diagram;
FIG. 3 is an equivalent block diagram of the embodiment shown in FIG. 5;
FIG . 4 is a frequency spectrum;
FIG. 5 is a schematical view of a first embodiment of the input stage in accordance with the invention;
FIG. 6 is a diagram of the signals applied to the device in accordance with the invention;
FIGS. 7(a)–7(c) are diagrams explaining the operation of the device shown in FIG. 5;
FIG. 8 is a variant embodiment of the device shown in FIG. 5;
FIGS. 10 and 9 respectively illustrate a second embodiment of the device in accordance with the invention, and its equivalent block diagram;
FIGS. 12 and 11 respectively illustrate a third embodiment of the device in accordance with the invention, and its equivalent block diagram;
FIGS. 13 and 14 are block diagrams of variant embodiments of the devices shown in FIGS. 9 and 11 respectively.

In these various figures, similar references relate to similar elements.

FIG. 1 is the block diagram of a low-pass filter also known as a transversal filter, of charge transfer design.

An input signal e(t) is applied to a sampling stage 1 of periodicity $T_e$. The thus sampled signal f(t) passes successively through a series of N elements $R_1 \ldots R_N$ each of which produces a delay equal to a whole number of periods $T_e$. At the output of each delay element R, the signal is picked off for multiplication by a coefficient: $h_1 \ldots h_N$, by the multiplier elements $M_1 \ldots M_N$, respectively located at the outputs of the delay elements $R_1 \ldots R_N$. The various signals furnished by the elements M are then added by an adder 2 to produce the output signal s(t).

The design of this kind of CTD filter is well-known and has been described in particular in an article entitled "Transversal filtering using charge-transfer devices" published by IEEE, Journal of Solid-State Circuits (April 1973 — Vol. SC8 — No. 2 — page 138).

FIG. 2 is a frequency diagram illustrating the problem of parasitic image frequencies. In this diagram, the sampling frequency $F_e$ has been illustrated as well as the theoretical pass band (3) of the transversal filter from zero to $F_c$, the cut-off frequency. Also illustrated is a component of the input signal of frequency ($F_S$) which is close to the sampling frequency $F_e$, that is to say is located between $F_e - F_c$ and $F_e + F_c$, and the parasitic image frequency $F_e - F_s$ which will be transmitted in full by the filter in the absence of any preliminary filtering at its input stage.

FIG. 3 is a diagram illustrating the principle of the input stage in accordance with the invention, which utilises the so-called cosine filtering method.

The input signal e(t) is applied simultaneously to two channels 4 and 5. In the channel 4 the signal is sampled by an element 6 at the frequency $F_e$. In the channel 5 it is also sampled (by an element 7) at the frequency $F_e$ albeit with a phase-shift of $T_e/2$ in relation to the channel 4. The first sample (channel 4) is delayed by a time equal to $T_e/2$ (element 8) in order to enable it to be added to the former (adder 9) to form the signal f(t) which is supplied to the transversal filter proper.

Calculation shows that the frequency response of this kind of device has the form of a cosine function whose modulus can be written:

$$|S(F)| = 2 \cdot \left| \sum_{k=-\infty}^{+\infty} E(F - k \cdot Fe) \cdot \cos\left(\frac{\pi \cdot Te \cdot F}{2} - k \cdot \frac{\pi}{2}\right) \right| \quad (1)$$

where S and E are the Fourier transforms of the signals f and e respectively, and k is a relative whole number.

To check that attenuation of the components at the image frequencies is indeed obtained, let us consider an input signal e(t) whose frequency spectrum can be expressed with the help of a gate function, that is to say having a bandwidth ΔF about the sampling frequency $F_e$. Then, the device produces the frequency response S (F) represented by the graph of FIG. 4, that is to say a response which is zero both for the frequency $F_e$ (k = o) and the frequency F = O (k = −1), with a substantial attenuation in the band ΔF around these frequencies.

The calculation which gives us the expression (1) shown on FIG. 4 applies to the case of perfect sampling devices (6 and 7), that is to say ones which are infinitely thin. But it has been demonstrated that for real sampling devices, the attenuation in the interval ΔF around F = 0, is not substantially affected.

An input stage in accordance with the diagram of FIG. 3 makes it possible, therefore, to suppress parasitic components of frequency zero and to attenuate parasitic components having frequencies within the band ΔF = (0, $F_c$) and due to the input signals whose frequency covers the band between $F_e - F_c$ and $F_e + F_c$.

FIG. 5 illustrates a plan view of a first embodiment of the input stage in accordance with the invention, as set out in the diagram of FIG. 3.

The device, in the conventional way with charge transfer devices, is constituted by a semiconductor substrate for example of silicon, covered by an insulating layer 10 (silicon oxide for example) and electrodes on the layer 10.

This device comprises means for sampling the input signal e(t), constituted by:

two diodes $D_4$ and $D_5$ formed by doped zones in the semiconductor substrate; they produce electrical charges capable or longitudinal transfer (that is to say along an axis Oz in the figure) in two parallel and electrically isolated channels, namely 4 and 5;

four electrodes, or gates, disposed transversely on the channels, respectively and successively $G_{41}$ and $G_{42}$ on the channel 4 and $G_{51}$ and $G_{52}$ on the channel 5, these electrodes being placed at potentials chosen, as indicated hereinafter, so that the electrical charges propagating through each of the channels 4 and 5 represent samples of the signal e(t) which are out of phase with one another by $T_e/2$ in the manner shown in the diagram of FIG. 3.

On the channel 4 there are then arranged, like the electrodes $G_{41}$ and $G_{42}$, two other electrodes 41 and 42 of the same width whereas the channel 5, at the same level, has only one electrode, 51, double the width of the foregoing ones. In this fashion, due to the potentials applied in the manner explained later on, a delay equal to $T_e/2$ is achieved in the channel 4 (corresponding to the element 8 in FIG. 3).

Finally, the input stage terminates in this figure in the form of an electrode 12 extending simultaneously over both the channels and effectively summing the samples formed in each of the channels (element 9 in FIG. 3), to form the signal f(t).

After the electrode 12, an axis XX illustrates the limit of the input stage of the filter (element 1 of FIG. 1). After this axis XX, electrodes 13 and 14 similar to the electrode 12, are arranged, these, however, constituting the first elements of the low-pass filter proper as schematically illustrated in FIG. 1. The latter is designed using some known technique or other, in particular to charge coupled device technique or bucket brigade device technique.

The operation of this device will be explained with the help of FIG. 6 which illustrates the forms of the various signals applied to the device, and of FIGS. 7(a)–7(c) are sectional views illustrating the electrical charge transfers performed in the channel 5 during different phases of operation.

Throughout the remainder of the description, it will be assumed that the semiconductor substrate is of N-type material. Of course, for a P-type substrate, it is merely necessary to reverse the polarity of all the applied potentials.

The first diagram (a) of FIG. 6 represents a potential $\phi_1$ applied to the electrodes 42, 13 and 51, as a function of time. This is a square wave function of periodicity $T_e$ and amplitude ranging between 0 and −V.

The second diagram (b) of FIG. 6 illustrates a potential $\phi_2$ applied to the electrodes 41, 12 and 14, as a function of time. It is identical to $\phi_1$ but out of phase with it by $T_e/2$.

The third diagram (c) of this same figure illustrates a potential $\phi_{EC1}$, applied to the electrode $G_{41}$ of the channel 4, as a function of time. This is a periodic (periodicity $T_e$) pulse of amplitude $-V_E$, slightly delayed in relation to the square wave of amplitude $-V$ of the signal $\phi_1$.

The fourth diagram (d) of FIG. 6 illustrates a potential $\phi_{EC2}$ applied to the electrode $G_{51}$ of the channel 5, as a function of time. This is the same signal as $\phi_{EC1}$ but is out of phase with it by $T_e/2$.

In this embodiment, injection of charges into the semiconductor is performed in the following way.

The diodes $D_4$ and $D_5$ are connected to a direct source $V_D$ and, more particularly, $+V_D$ in the case where the diodes are constituted by a zone (15) of P-type material in a substrate (11) of N-type material. The substrate is then placed at a potential $+V_s$ which is higher than $V_D$, in order to prevent the diodes from being forward-biased (FIG. 7a).

If we consider the channel 5, then it will be seen that in a first phase illustrated by the diagram (a) of FIG. 7, the gate $G_{51}$ is placed at a potential $\phi_{EC2}$ equal to $-V_E$, represented by a broken line 16 in the substrate 11 at the location of the electrode $G_{51}$. At the same instant, the input signal e(t) applied to the gate $G_{52}$ has a value illustrated by the line 17 and the electrode 51 is maintained at a potential $\phi_1 = 0$ (line 19). The charge carriers produced by the diode $D_5$ are then transferred by a normal process occurring in charge transfer devices, into the neighbouring zones beneath the gates $G_{51}$ and $G_{52}$ until a zone of uniform potential (line 18) has been developed beneath these electrodes, said potential being defined by the bias potential on the diode $D_5$.

In a second phase, illustrated in FIG. 6 by the diagram b, the potential $\phi_1$ is still zero but the potential $\phi_{EC2}$ is zero as well. Thus, beneath the single electrode $G_{52}$, electrical charges remain whose quantity is a function of the bias voltage $V_E$ on the diode $D_5$ and of the value of the input signal e(t) during the time of a pulse $\phi_{EC2}$. The signal e(t) is thus sampled.

The third diagram in FIG. 7(c) illustrates the transfer beneath the electrode 51, during a phase in which $\phi_1 = -V$, of the charges previously maintained beneath the gate $G_{52}$. It should be noted that at this instant, the gate $G_{52}$ is isolated from the signal e(t) by a contactbreaker 53 operated synchronously with the signal $\phi_1$ in the manner illustrated in FIG. 5.

The injection of electrical charges into the channel 4 is performed in the same way but with a phase avance of $T_e/2$ in relation to channel 5.

In the diagram of FIG. 5, it can be seen that the charges in the channel 4 are transferred towards the common electrode 12 through the medium of two electrodes (41 and 42) respectively supplied with the signals $\phi_1$ and $\phi_2$, whilst the charges in the channel 5 encounter only one electrode (51) in their movement towards the electrode 12. That is to say that the sample produced in the channel 4 and the sample produced with a delay of $T_e/2$ in the channel 5, arrive simultaneously beneath the electrode 12 where they are then added.

FIG. 8 illustrates a variant embodiment of the device shown in FIG. 4 in which the execution of sampling differs in terms of the signals applied but in which the structure (substrate, diodes and electrodes) remains unchanged.

In FIG. 8 the signals $\phi_{EC1}$ and $\phi_{EC2}$ are still applied respectively to the gates $G_{41}$ and $G_{51}$, but the signals applied on the one hand to the diodes $D_4$ and $D_5$ and on the other to the gates $G_{42}$ and $G_{52}$, are reversed. In FIG. 8, it is the diodes ($D_4$ and $D_5$) which have the input signal e(t) applied to them through the medium of switches (43 and 53) controlled synchronously with the signals $\phi_1$ and $\phi_2$ as indicated in FIG. 5.

Operation is similar to that already described.

Other methods are known where the sampling of the input signal is concerned, such as the method known as potential equilibration, which can be used in the device in accordance with the invention without modifying either the principe (FIG. 3) or the structure with its two parallel channels operating in antiphase and carrying a dissimilar number of electrodes whilst being linked by one and the same summing electrode.

In the foregoing, an input stage has been described which comprises what we may call an elementary network performing cosine filtering (cos $\pi.F.Te/2$). It is possible, in order to improve the efficiency of filtering, to perform cosine squared filtered ($\cos^2 \pi.F.Te/2$) or more generally filtering in accordance with the function of cosine to the power n, ($\cos^n \pi.F.Te/2$). The effect of this is to improve the attenuation at frequencies close to the stopped frequency ($F_e$).

To achieve cosine squared filtering it is possible to arrange in parallel two identical elementary networks which, however, operate in antiphase, in the manner shown in the block diagram of FIG. 9.

The first network is designed like that of FIG. 3, with the same references, and from the input signal e(t) produces a signal $e_1(t)$ at the output of the adder 9.

The second network is constituted in the same manner, by two channels:

the first channel, 61, corresponds to the channel 4 of the first network and has a sampling device 64 and an element 63 introducing a delay of $T_e/2$;

the second channel, 62, has a sampling device 65 which produces from the input signal e(t) a signal out of phase by $T_e/2$ in relation to that in the channel 61. The signals furnished by the two channels 61 and 62 are added by an element 66 in order to furnish a signal $e_2(t)$ which is in antiphase with $e_1(t)$.

The signal $e_2(t)$ is therefore delayed by $T_e/2$ (element 67) in order to be added to the signal $e_1(t)$ (element 68) and furnish a signal $f_1(t)$ constituting the input signal for the low-pass filter.

FIG. 10 illustrate an embodiment of the diagram of FIG. 9.

As far as the channels 4 and 5 are concerned, the design is identical to that of FIG. 5 and a signal $e_1(t)$ is obtained at the output of a summarizing electrode 69, the latter extending over the set of two channels 4 and 5 like the electrode 12 of FIG. 5.

The channels 61 and 62 carry electrodes arranged in a similar fashion to furnish the signal $e_2(t)$ at the output of an electrode 7 similar to the electrode 12.

To produce a delay equal to $T_e/2$ in the signal $e_2(t)$ (element 67 of FIG. 9), the same procedure as before is used: A single electrode 69 on the channel carrying the signal $e_1(t)$ and two separate electrodes 70 and 71 on the channel carrying the signal $e_2(t)$, these electrodes being supplied in antiphase (signals $\phi_1$ and $\phi_2$ of FIG. 10).

The signals $e_1$ and $e_2$ are added by means of a single electrode 72 extending over the assembly of channels 4, 5, 61 and 62, in order to furnish the signal $f_1(t)$.

As before, the axis XX marks the limit between the input stage and the transversal filter.

FIGS. 11 and 12 are block diagrams of another embodiment of the input stage in accordance with the invention, in which once again cosine squared filtering is performed, since it can be written in the following way:

$$\cos^2 \frac{\pi \cdot F \cdot Te}{2} =$$
$$\left| \frac{e^{-j \cdot \frac{\pi \cdot F \cdot Te}{2}} + e^{j \cdot \frac{\pi \cdot F \cdot Te}{2}}}{2} \right|^2 =$$
$$\frac{e^{j \cdot \pi \cdot F \cdot Te}}{4} \cdot \left[ 1 + e^{-j \cdot \pi \cdot F \cdot Te} \right]^2 =$$
$$\frac{e^{j \cdot \pi \cdot F Te}}{4} \cdot \left[ 1 + 2 e^{-j \cdot \pi \cdot F \cdot Te} + e^{-2j \cdot \pi \cdot F \cdot Te} \right]$$

that is to say that it is possible to achieve $\cos^2 (\pi.F.Te/2)$ filtering by adding the undelayed signal to the same signal delayed by $T_e/2$ and twice multiplied, and, finally, to the same signal delayed by $T_e$.

FIG. 11 shows the block diagram. It comprises three channels:

the channel 27 in which the signal e(t) is sampled in accordance with $\phi_{EC1}$ (element 20) and is undelayed;

the channel 28 in which the signal e(t) is sampled in accordance with $\phi_{EC2}$ (element 22) then delayed by $T_e/2$ (element 23) and multiplied by two (element 21);

the channel 29 in which the signal e(t) is sampled in accordance with $\phi_{EC1}$ (element 24) and delayed by $T_e$ (element 25).

The signals produced by the three channels are then added (element 26) to produce the input signal $f_2(t)$ for the filter.

FIG. 12 illustrates an embodiment according to this block diagram.

In this figure, there can be seen three insulated channels (27, 28 and 29), one of them (28) having double the width in order to represent the coefficient 2.

Each of the channels comprises means for sampling the signal, namely a diode (D) and two gates respectively supplied with the sampling signal ($\phi_{EC1}$ or $\phi_{EC2}$ depending upon the channel) and the input signal (e), as well as electrodes whose width in the direction oz of propagation of the charges through the device, is a function, as before, of the delay to be introduced into the signal. This translates into terms of a single electrode (30) for the channel 27, two electrodes (31 and 32) of half of the width for the channel 28 and three electrodes (33, 34 and 35) whose width is three times smaller, for the channel 29.

The signals produced by the different channels are added by an electrode 36 extending over the complete set of channels.

FIGS. 13 and 14 are block diagrams of an input stage in which cosine cubed ($\cos^3 \pi.F.Te/2$) filtering is performed, either by means of elementary parallel-connected networks (FIG. 13) or by breaking down the cosine expression as in the case of FIGS. 11 and 12.

As far as FIG. 13 is concerned, each elementary network is constituted in the manner shown in FIG. 3, that is to say made up of two channels each with the sampling device marked E, the channels operating in antiphase and one of them being followed by an element R introducing a delay of $T_e/2$, the two channels terminating in an adder S.

The device shown in FIG. 13 comprises four elementary networks operating two by two in antiphase and connected by an adder S, a delay of $T_e/2$ (element R) being introduced into one of the channels. Finally, the two groups of two networks are connected together in the same fashion to furnish the output signal $f_3(t)$ of the stage.

As far as FIG. 14 is concerned, the expansion of the cosine function yields a four-channel (37 to 40) device, each channel comprising a sampling device E controlled as before with a phase such that the signals to be added are in-phase. The first channel (37) transmits the sampled signal directly to an adder S, without any delay. The second channel (38) transmits the sampled signal to the adder R after multiplication by a factor of 3 and a delay (element R) equal to $T_e/2$. The third channel (39) transmits the sampled signal to the adder S after multiplication by a factor of 3 and a delay (element $R_1$) equal to $T_e$. The fourth channel (40) transmits the sampled signal to the adder S after a delay (element $R_2$) equal to 3 Te/2.

Practical design of this kind of system will be apparent from FIGS. 13 and 14 in a manner similar to that adopted for FIGS. 10 and 12 working from FIGS. 9 and 11.

For FIG. 14, it can thus obtained a system with four channels connected by a summing electrode:
- the first channel has two electrodes and triple the width of the second channel;
- the second channel has only one electrode;
- the third channel is equal in width to the first channel and has three electrodes supplied in antiphase, the third being in phase with the second electrode of the first channel;
- the fourth channel is equal in width to the second channel and has four electrodes supplied successively in antiphase, the fourth being in phase with the second electrode of the first channel.

Finally, in the same fashion, it is possible to design input stages which perform filtering in accordance with a function $\cos^n (\pi.F.Te/2)$, where $n > 3$.

What is claimed is:

1. An input stage for a CTD low-pass filter, comprising a semiconductor substrate, an insulating layer deposited upon the substrate, said substrate comprising at least two insulated channels, each channel receiving said input signal and comprising sampling means, said sampling means comprising a diode formed in said substrate and two sampling gates, arranged upon said insulating layer, the samples being constituted by electrical charges capable of moving through said substrate, the sampling performed in the first channel exhibiting a phase advance in relation to the sampling performed in the second channel, substantially equal to half the sampling period, said stage further comprising electrodes arranged on each of said channels after said sampling gates, in order to delay the sample formed in the first channel by a time substantially equal to said phase advance, said channels being united by a single summing electrode, extending over the two channels.

2. An input stage as claimed in claim 1, wherein said electrodes of said first channel at least comprises a first and a second electrode supplied in antiphase with a potential whose value varies with time in accordance with a squarewave function of period equal to the sampling period, and said second channel comprises a single electrode, supplied with said potential in phase with said second electrode on said first channel, said summing electrode being supplied with said potential in phase with said electrode of said second channel.

3. An input stage for a CTD low-pass filter, comprising a plurality of elementary networks, each network being constituted by an assembly of two channels connected by a summing electrode, as claimed in claim 1, said elementary networks operating by groups of two, the networks of the same group being designed so that their summing electrodes operate in antiphase, the output of the first of the networks of the same group being connected to a delay element producing in one of said outputs a delay equal to the phase-shift between the two networks of the same group, the output of said delay element and the output of the second of the network of the same group being connected by a further summing electrode, the output of which constitutes the output of said group, the outputs of said groups being connected together, in successive stages, to form, ultimately, a single output for said plurality of elementary networks.

4. An input stage as claimed in claim 3, wherein said delay element is constituted by two delay electrodes supplied in antiphase with a potential whose value varies with time in accordance with a square wave function of period equal to the sampling period, the ensuing summing electrode being supplied with said potential in phase with the first of said delay electrodes, said output of the second network being connected to the summing electrode by means of a further electrode, supplied with said potential in antiphase with said ensuing summing electrode.

5. An input stage as claimed in claim 2, wherein said first channel has twice the width of said second channel, said stage further comprising a third channel having a width equal to that of said second channel, equipped with three electrodes supplied with said potential successively and in antiphase, the third being in phase with the second electrode of said first channel and the three channels being connected by said summing electrode.

6. An input stage as claimed in claim 1, which effects filtering in accordance with a cosine to the power n function, by a series expansion in said cosine function, comprising a plurality of channels each corresponding to a term of said expansion, each of said channels having a width which is a function of the coefficient multiplying the term to which it corresponds, and each being equipped with a number of electrodes which is a function of the phase-shift of said term in relation to the other terms, and said channels being connected by said summing electrode.

* * * * *